United States Patent
Miyahara et al.

(10) Patent No.: US 12,080,552 B2
(45) Date of Patent: Sep. 3, 2024

(54) METHOD OF DEPOSITING SILICON FILM AND FILM DEPOSITION APPARATUS

(71) Applicant: Tokyo Electron Limited, Tokyo (JP)

(72) Inventors: Tatsuya Miyahara, Yamanashi (JP); Yoshihiro Takezawa, Yamanashi (JP); Daisuke Suzuki, Yamanashi (JP); Hiroyuki Hayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 141 days.

(21) Appl. No.: 17/654,628

(22) Filed: Mar. 14, 2022

(65) Prior Publication Data
US 2022/0319845 A1    Oct. 6, 2022

(30) Foreign Application Priority Data
Apr. 6, 2021   (JP) ................. 2021-064987

(51) Int. Cl.
| | | |
|---|---|---|
| H01L 21/02 | (2006.01) | |
| C23C 16/24 | (2006.01) | |
| C23C 16/52 | (2006.01) | |
| C30B 28/02 | (2006.01) | |

(52) U.S. Cl.
CPC ........ H01L 21/02667 (2013.01); C23C 16/24 (2013.01); C23C 16/52 (2013.01); C30B 28/02 (2013.01); H01L 21/02532 (2013.01); H01L 21/02592 (2013.01)

(58) Field of Classification Search
CPC ......... H01L 21/02667; H01L 21/02532; H01L 21/02592; C23C 16/24; C23C 16/52; C30B 28/02
See application file for complete search history.

(56) References Cited

U.S. PATENT DOCUMENTS

| | | | | |
|---|---|---|---|---|
| 2007/0235074 | A1* | 10/2007 | Henley | ............... H01L 31/0392 136/252 |
| 2011/0263105 | A1* | 10/2011 | Hasebe | ................... C23C 16/24 977/890 |
| 2020/0161130 | A1* | 5/2020 | Motoyama | .............. C23C 16/52 |

FOREIGN PATENT DOCUMENTS

JP    2015-045082    3/2015

* cited by examiner

*Primary Examiner* — Julia Slutsker
(74) *Attorney, Agent, or Firm* — IPUSA, PLLC

(57) ABSTRACT

To provide a method of depositing a silicon film that can crystallize the silicon film at low temperature and in a short time, and also can deposit the silicon film with high flatness. A method of depositing a silicon film includes supplying a silicon-containing gas on a seed layer, depositing an amorphous silicon film on the seed layer, supplying chlorosilane gas to the amorphous silicon film, and crystallizing the amorphous silicon film while forming a chlorosilane cap layer on the amorphous silicon film.

4 Claims, 5 Drawing Sheets

METHOD OF DEPOSITING SILICON FILM AND FILM DEPOSITION APPARATUS

CROSS-REFERENCE TO RELATED APPLICATION

The present application is based on and claims priority to Japanese patent application No. 2021-064987, filed Apr. 6, 2021, with the Japanese Patent Office, the entire contents of which are hereby incorporated by reference.

BACKGROUND OF THE INVENTION

1. Field of the Invention

The present invention relates to a method of depositing a silicon film and a film deposition apparatus.

2. Description of the Related Art

Conventionally, a method of depositing a silicon film, in which a silicon film is deposited by supplying a higher-order aminosilane-based gas containing two or more silicon in a molecular formula on a processing surface, adsorbing silicon to form a seed layer (Step 1), supplying a silane-based gas without an amino group on the seed layer and depositing silicon on the seed layer (Step 2), wherein a processing temperature in Step 1 is set to 350° c. or less at room temperature (25° c.) or more, is known (for example, Patent Document 1).

[Patent Document 1] Japanese Patent Application Laid-Open No. 2015-45082

SUMMARY OF THE INVENTION

A method of depositing a silicon film that can be deposited at a high-temperature to form a silicon film high in flatness is provided.

Means for Solving Problems

A method of depositing a silicon film includes supplying a silicon-containing gas on a seed layer, depositing an amorphous silicon film on the seed layer, supplying chlorosilane gas to the amorphous silicon film, and crystallizing the amorphous silicon film while forming a chlorosilane cap layer on the amorphous silicon film.

Effects of the Invention

According to the present disclosure, a silicon film with excellent flatness can be deposited.

DESCRIPTION OF THE PREFERRED EMBODIMENTS

Hereinafter, embodiments for carrying out the present invention will be described with reference to the drawings.

[Film Deposition Apparatus]

Figure 1:
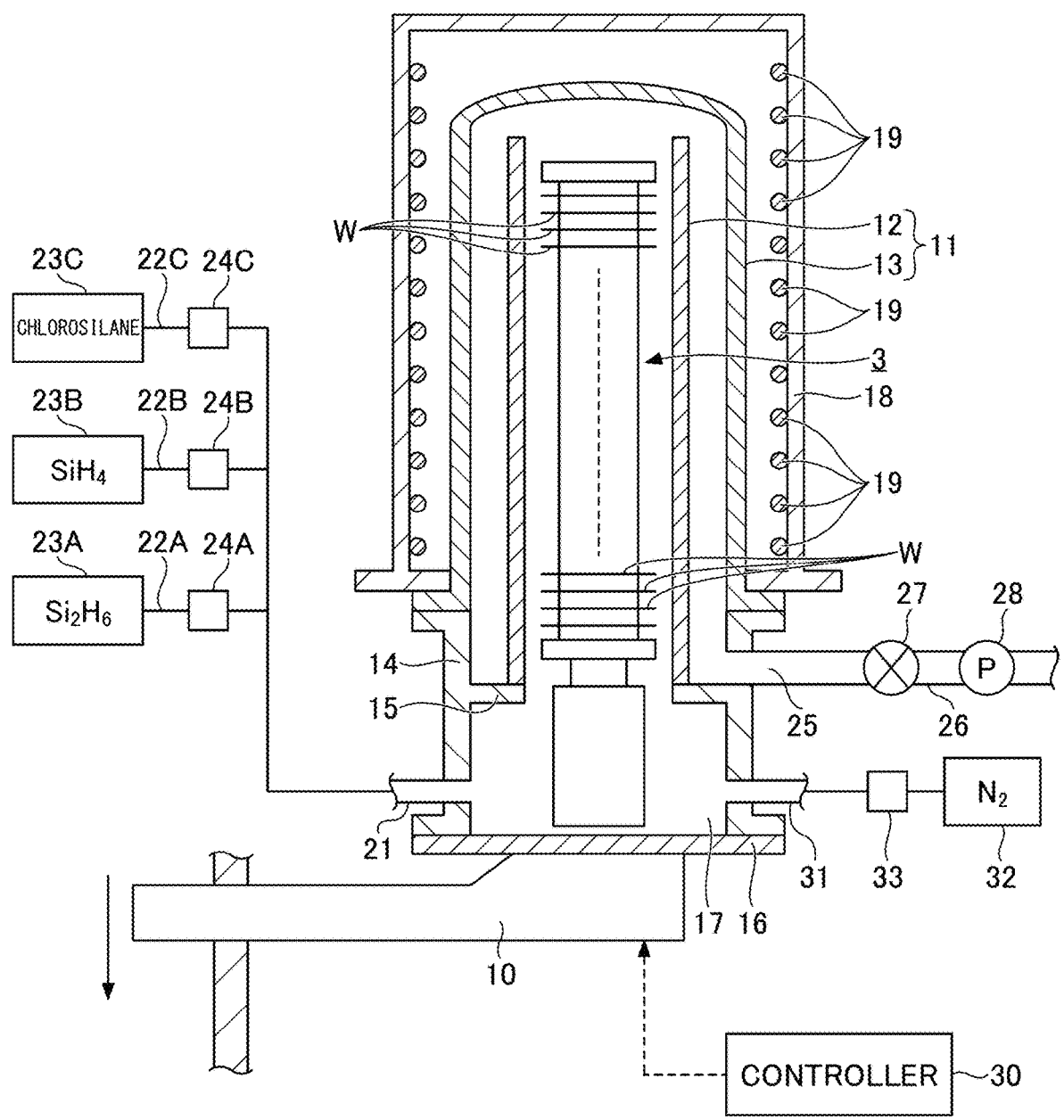
FIG. 1 is a diagram illustrating a film deposition apparatus according to an embodiment of the present disclosure.

FIG. 1 is a diagram illustrating a film deposition apparatus according to an embodiment of the present disclosure. In the present embodiment, an example in which a film deposition apparatus is configured as a vertical heat treatment device will be described. The film deposition apparatus according to the present disclosure is not limited to the vertical heat treatment device, and may be applied to various film deposition apparatuses. Applicable film deposition apparatuses include a single-wafer film forming deposition apparatus and a semi-batch film forming deposition apparatus. In the present embodiment, an example in which the film deposition apparatus is configured as the vertical heat treatment device will be described.

The vertical heat treatment device deposits a Chemical Vapor Deposition (CVD) to form a crystallized silicon film on a silicon oxide film substrate.

The vertical heat treatment device includes a reaction tube 11 which is a substantially cylindrical vacuum vessel oriented vertically in the longitudinal direction. The reaction tube 11 includes a dual tube structure including an inner tube 12 and an outer tube 13 with a ceiling formed so as to cover the inner tube 12 and to have a constant spacing with the inner tube 12. The inner tube 12 and the outer tube 13 are formed of a heat resistant material such as quartz. The reaction tube 11 may be referred to as a processing chamber because the reaction tube 11 forms a closed space for processing substrates.

A film deposition apparatus includes a processing chamber, a substrate holder to hold a substrate disposed in the processing chamber, a heater to heat the substrate holder, a silicon-containing gas supply to supply silicon-containing gas to the substrate holder and to deposit an amorphous silicon film on the substrate, a chlorosilane gas supply to supply chlorosilane gas to the substrate holder and to form a chlorosilane cap layer on the amorphous silicon film, and a controller configured to set the heater to a first temperature in response to supply of the silicon-containing gas from the silicon-containing gas supply, and to set the heater to a second temperature higher than the first temperature in response to supply of the chlorosilane gas from the chlorosilane gas supply.

A manifold 14 made of stainless steel (SUS) formed in a cylindrical shape is disposed below the outer tube 13. The manifold 14 is air-tightly connected to the lower end of the outer tube 13. The inner tube 12 protrudes from the inner wall of the manifold 14 and is supported by a support ring 15 integrally formed with the manifold 14.

A lid 16 is disposed below the manifold 14, and a boat elevator 10 allows the lid 16 to be raised and lowered between the raised and lowered positions. In FIG. 1, the lid 16 in the raised position is illustrated. While the lid 16 in this raised position, an opening 17 of the reaction tube 11 below the manifold 14 is closed and the inside of the reaction tube 11 is sealed air-tight. The lid 16 includes a wafer boat 3 made of, for example, quartz. The wafer boat 3 is configured to hold a number of wafers W to be processed as substrates horizontally with predetermined vertical spacing. Around the reaction tube 11, an insulator 18 is provided to surround the reaction tube 11, and an internal wall thereof is provided with a heater 19 made of a resistive heating element, which is, for example, a heating portion, so that the inside of the reaction tube 11 can be heated.

At the manifold 14, a processing gas inlet tube 21 and a purge gas inlet tube 31 are inserted below the support ring 15 described above. The downstream end of each processing gas inlet tubes 21 and 31 is arranged so as to supply gas to a wafer W within the inner tube 12. For example, the upstream side of the processing gas inlet tube 21 branches to form branches 22A to 22C, and each upstream end of the branches 22A to 22C is connected to a source 23A of disilane ($Si_2H_6$) gas, a source 23B of monosilane ($SiH_4$) gas, and a source 23C of chlorosilane gas. The branches 22A to 22C are provided with gas supply equipment 24A to 24C, respectively. The gas supply equipment 24A to 24C each include valves and mass flow controllers, each configured to control a flow rate of the process gas fed from the gas supply sources 23A to 23C to the processing gas inlet tube 21.

The $Si_2H_6$ gas is a seed layer forming gas for forming a seed layer on the surface of the silicon oxide film substrate, and the gas supply source 23A and the gas supply equipment 24A constitute the $Si_2H_6$ (disilane) gas supply.

The $Si_2H_6$ gas may also be used as a silicon-containing gas to further deposit an amorphous silicon film on a second seed layer. Details are given below.

The disilane gas supply is a gas supply for forming a seed layer. Therefore, the disilane gas supply may be referred to as a seed layer forming gas supply.

In the present embodiment, an example in which one type of gas for forming the seed layer is used is described. However, two or more types of gases for forming the seed layer may be used. In addition, when a film is deposited on the wafer W in which the seed layer is already formed, the seed layer forming gas supply need not necessarily be present. Furthermore, gases other than $Si_2H_6$ gas may be used even when the seed layer forming gas supply is used. For example, DIPAS (diisopropylaminosilane gas) may be used. In this manner, the disilane gas supply as an example and the seed layer forming gas supply may be provided as needed.

The $SiH_4$ gas is a deposition gas for depositing a silicon (Si) film onto the wafer W on which the sheet layer is formed, and the gas supply source 23C and the gas supply equipment 24C include a silicon-containing gas supply. The silicon-containing gas is a gas used for depositing a film. Therefore, the silicon-containing gas supply may be referred to as a film deposition gas supply.

Chlorosilane gas is a gas for forming a capping layer on the surface of a silicon film and contains silicon and chlorine. The gas supply 23C and the gas supply equipment 24C constitute a chlorosilane gas supply. Since the chlorosilane gas is a gas used for forming the capping layer, the chlorosilane gas supply may be referred to as the capping gas supply.

The chlorosilane gas may be a variety of chlorosilane gases such as $SiH_2Cl_2$, dichlorosilane, (hereinafter referred to as "DCS"), trichlorosilane gas, tetrachlorosilane, hexachlorodisilane (HCD), and the like.

The upstream side of the purge gas inlet tube 31 is connected to a gas supply source 32 of nitrogen ($N_2$) gas which is purge gas. A gas supply equipment 33 is disposed at an intermediate location in the purge gas inlet tube 31. The gas supply equipment 33 is configured similar to the gas supply equipment 24A to 24C to control the flow of purge gas downstream of the purge gas inlet tube 31.

The exhaust port 25 opens to the side surface of the support ring 15 on the manifold 14. The exhaust gas generated by the inner tube 12 passes through a space formed between the inner tube 12 and the outer tube 13 and is exhausted to the exhaust port 25. An exhaust pipe 26 is air-tightly connected to the exhaust port 25. A valve 27 and a vacuum pump 28 are disposed in the exhaust pipe 26 in this order from an upstream side of the exhaust pipe 26. By adjusting the opening of the valve 27, the pressure in the reaction tube 11 is controlled to the desired pressure.

The vertical heat treatment device includes a controller 30 which includes a computer, and the controller 30 is provided with a program. In this program, a group of steps is configured so that a control signal can be output to each portion of the vertical heat treatment device 1 to control the operation of each portion so that a series of processing operations described below can be performed on the wafer W. Specifically, a control signal is outputted to control the elevation of the lid 16 by the boat elevator 10, the output of the heater 19 (i.e., the temperature of the wafer W), the opening of the valve 27, and the flow rate of each gas into the reaction tube 11 by the gas supply equipment 24A to 24C, and 33. The program is stored in a storage medium such as a hard disk, a flexible disk, a compact disk, a magneto optical disk (MO), a memory card, or the like in the controller 30.

The controller 30 controls the temperature of the heater 19 to adjust the temperature of the heater 19 to a temperature suitable for a silicon film deposition when forming the silicon film, and to adjust the temperature of the heater 19 to a temperature suitable for a chlorosilane layer when forming a capping layer made of chlorosilane on the silicon film.

[Method of Depositing Film]

FIG. 2 is a diagram for explaining an example of a method of depositing a silicon film according to an embodiment of the present disclosure. Refer to FIG. 1, which illustrates the configuration of the device, as appropriate.

An example will be described in which disilane ($Si_2H_6$) is used as the gas forming the seed layer, monosilane ($SiH_4$) is used as the gas forming a silicon bulk layer, and dichlorosilane (DCS) is used as the chlorosilane gas. In this embodiment, for ease of understanding, specific gasses will be described. The types of gases that form the seed layer are not limited to the various gases that are capable of forming the seed layer. The gases that are to form the silicon bulk layer are capable of forming the silicon bulk layer. Various types of chlorosilane gases may be used as the chlorosilane gas. The types of gases are not limited to this embodiment.

Figure 2A:
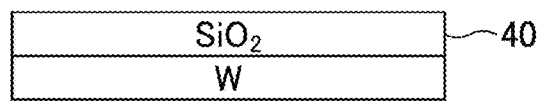
FIG. 2A to 2D are diagrams explaining an example of a method of depositing a silicon film according to an embodiment of the present disclosure.

FIG. 2A is a diagram illustrating the initial state of the wafer W. As illustrated in FIG. 2A, a silicon oxide ($SiO_2$) is formed on the surface of the wafer W. The silicon oxide film serves as an underlying layer.

First, the wafer W illustrated in FIG. 2A is transported and held in the wafer boat 3 by a transport equipment (not shown). Thereafter, the wafer boat 3 is placed on the lid 16 which is in the lowered position. The lid 16 is then raised to the raised position thereby introducing the wafer boat 3 into the reaction tube 11 and closing the opening 17 of the reaction tube 11 so that inside of the reaction tube 11 is air-tight. Subsequently, when the purge gas is supplied into the reaction tube 11, the gas inside of the reaction tube 11 gets exhausted and the inside of the reaction tube 11 becomes vacuum atmosphere of predetermined pressure. At the same time, the wafer W is at a predetermined temperature by the heater 19. The temperature is set to a predetermined deposition temperature suitable for depositing the silicon film on the wafer W. The temperature control of the heater 19 may be performed by the controller 30.

Figure 2B:
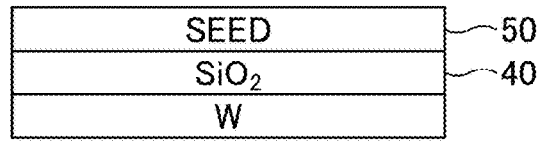

FIG. 2B illustrates an example of a seed layer forming process.

After the wafer W is heated, the purge gas supply is stopped and the disilane gas is supplied into the reaction tube 11. The disilane gas is deposited on the surface of the silicon oxide film 40 of the wafer W, and a seed layer 50 is formed to coat a silicon oxide film 43 (not shown).

Figure 2C:
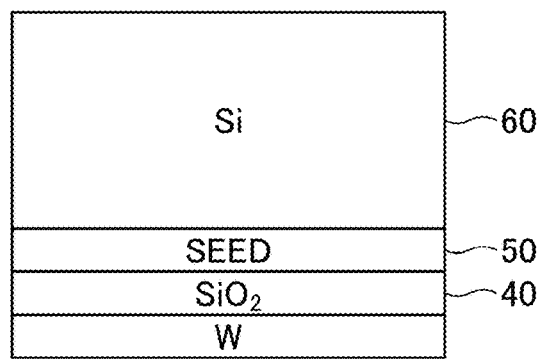

FIG. 2C illustrates an example of a silicon film deposition process.

After the seed layer forming process, the purge gas supply is stopped and $SiH_4$ gas is supplied into the reaction tube 11. As illustrated in FIG. 2C, $SiH_4$ gas is deposited on the seed layer 50 and formed over the surface of the wafer W such that a Si film 60 covers the seed layer 50. The $SiH_4$ gas continues to be deposited and the silicon film 60 grows. That is, the thickness of the silicon film 60 increases. The silicon film 60 may be referred to as a silicon bulk layer 60.

The silicon film deposition process sets the temperature of the heater 19 to a temperature suitable for forming the silicon film 60. The suitable temperature for forming the silicon film 60 is, for example, 450° c. or higher and less than 540° c. For example, when monosilane gas is used as a silicon-containing gas, the temperature of the heater 19 may be set to 480° c. to form the silicon film 60. The temperature in the silicon film deposition process is also called a first temperature.

Alternatively, the $Si_2H_6$ gas may be used instead of the $SiH_2$ gas. In this case, the silicon film deposition process may be continuously performed after the seed layer forming process.

In the silicon film deposition process, an amorphous silicon film 60 is formed on the surface of the wafer W.

After stopping supply of the $SiH_4$ gas or $Si_2H_6$ gas, purge gas is supplied into the reaction tube 11 and $SiH_4$ gas or $Si_2H_6$ gas is purged from the reaction tube 11.

Figure 2D:
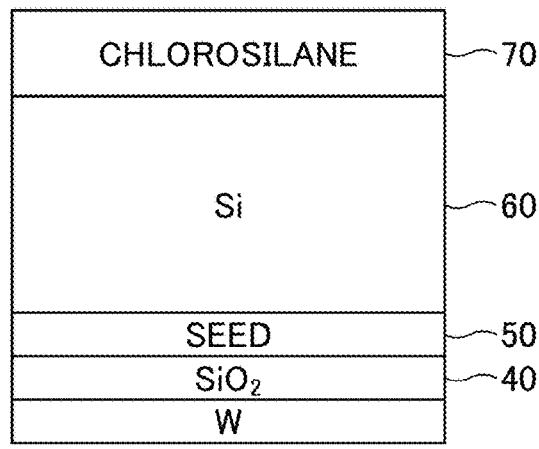

FIG. 2D illustrates an example of a capping process. In the capping process, the temperature of the heater 19 is set higher than that of the silicon film deposition process, and chlorosilane gas is supplied into the reaction tube 11 to form a capping layer 70 of chlorosilane.

The temperature of the heater 19 in the capping process is set to a temperature suitable for forming the capping layer 70 of chlorosilane, for example, 500° c. or higher and 700° c. or lower. The temperature in the capping process is also called a second temperature.

By forming the chlorosilane capping layer 70, crystallization is achieved while maintaining the flatness of the silicon film 60. In the capping process, the temperature is set higher than when the silicon film 60 is deposited, and crystallization of the silicon film 60 proceeds.

Conventionally, when the silicon film 60 is crystallized, the silicon film 60 is simply heated to crystallize without supplying chlorosilane. In this case, crystal grains were formed on the surface of the silicon film 60, and crystallization proceeds with crystal grains as the core, resulting in irregularities on the surface of the silicon film 60, which were inconvenient for use as a device.

In the method of depositing the silicon film according to the present embodiment, the silicon film 60 is heated while supplying chlorosilane, for example, DCS, on the surface of the silicon film 60. Then, the silicon film 60 crystallizes while maintaining the flatness at a temperature of 550° c. or higher and 600° c. or lower, and preferably 560° c. or higher and 580° c. or lower.

It is considered that chlorine has the effect of promoting crystallization without forming such crystal grains. Therefore, a high flatness crystallized silicon film 60 can be obtained by performing low-temperature annealing while supplying chlorosilane.

After the process of FIG. 2D, annealing may be performed at an even higher temperature, if necessary. In this case, annealing may be performed in the film deposition apparatus or the wafer W may be moved to an annealing apparatus. The additional annealing process may be set at any temperature higher than the temperature in the capping process. The additional annealing temperature may be set at a predetermined temperature, for example, 600° C. or higher and 700° C. or lower. Crystallization of the silicon film 60 can be further promoted by providing such the additional annealing process.

FIG. 3 is a diagram illustrating a comparison of the silicon film deposited by the method of depositing the silicon film according to the present embodiment and another silicon film.

Figure 3A:
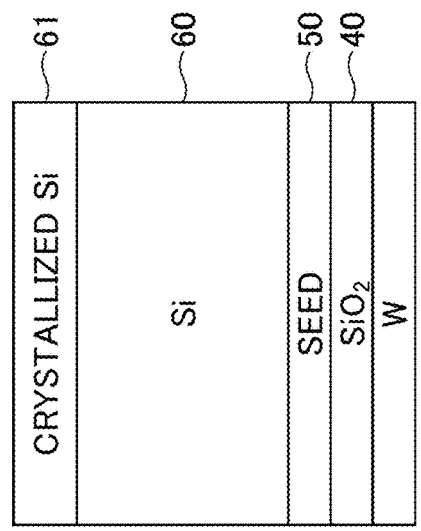
FIG. 3A to 3C are diagrams illustrating a comparison of the silicon film deposited by the method of depositing the silicon film according to the present embodiment and another silicon film.

FIG. 3A illustrates the silicon film 60 and the capping layer 70 that are deposited by the method of depositing the silicon film according to the present embodiment. The crystallization of the silicon film 60 can be performed at a low temperature while maintaining flatness by forming the capping layer 70 made of chlorosilane on the surface.

Figure 3B:
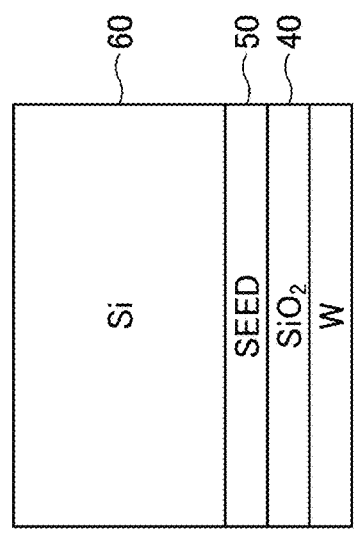

FIG. 3B illustrates a non-crystallized silicon film. As illustrated in FIG. 3B, simply by depositing the silicon film 60, the silicon film 60 is not crystallized and is not completed as a device.

Figure 3C:
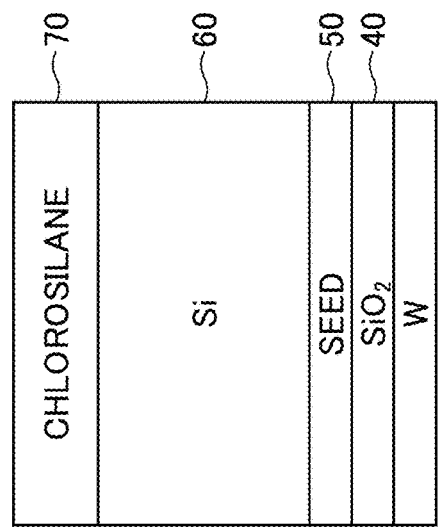

FIG. 3C illustrates a silicon film crystallized by conventional heating. As illustrated in FIG. 3C, a surface 61 of the silicon film 60 is crystallized when heated as is after FIG. 3B. However, crystal grains are formed on the surface 61. Therefore, irregularities are formed on the surface and crystallization of the flat silicon film 60 cannot be obtained. The heating temperature should also be set to a temperature higher than 600° C.

EXAMPLES

Hereinafter, an embodiment in which a method of depositing a silicon film according to the present embodiment was implemented will be described.

Figure 4:
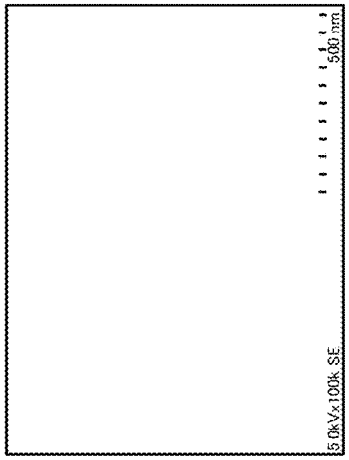
FIG. 4 is a diagram illustrating for explaining a surface roughness of an embodiment in which the method of depositing the silicon film according to the present embodiment is implemented.

FIG. 4 is a diagram for explaining a surface roughness of an embodiment in which the method of depositing the silicon film according to the present embodiment was performed.

Portion (a) in FIG. 4 is an image illustrating a surface state when a silicon film was simply deposited, as the reference data. As illustrated in the portion (a) in FIG. 4, when the amorphous silicon film was deposited, the surface state was clean. Nevertheless, the silicon film was not crystallized.

Portion (b) in FIG. 4 is an image illustrating a surface state when the amorphous silicon film was at 550° C. or higher and 580° C. or lower and crystallized. As illustrated in the portion (b) in FIG. 4, crystal grains were formed on the surface. Therefore, flatness of the silicon film cannot be maintained.

Portion (c) in FIG. 4 is an image illustrating a surface state when the method of depositing the silicon film according to this embodiment was performed. The portion (c) in FIG. 4 indicates an example such that the silicon film was annealed while supplying chlorosilane gas at 550° C. or higher and 580° C. or lower. As illustrated in the portion (c) in FIG. 4, there are no grains on the surface and the surface remains flat.

Figure 5:
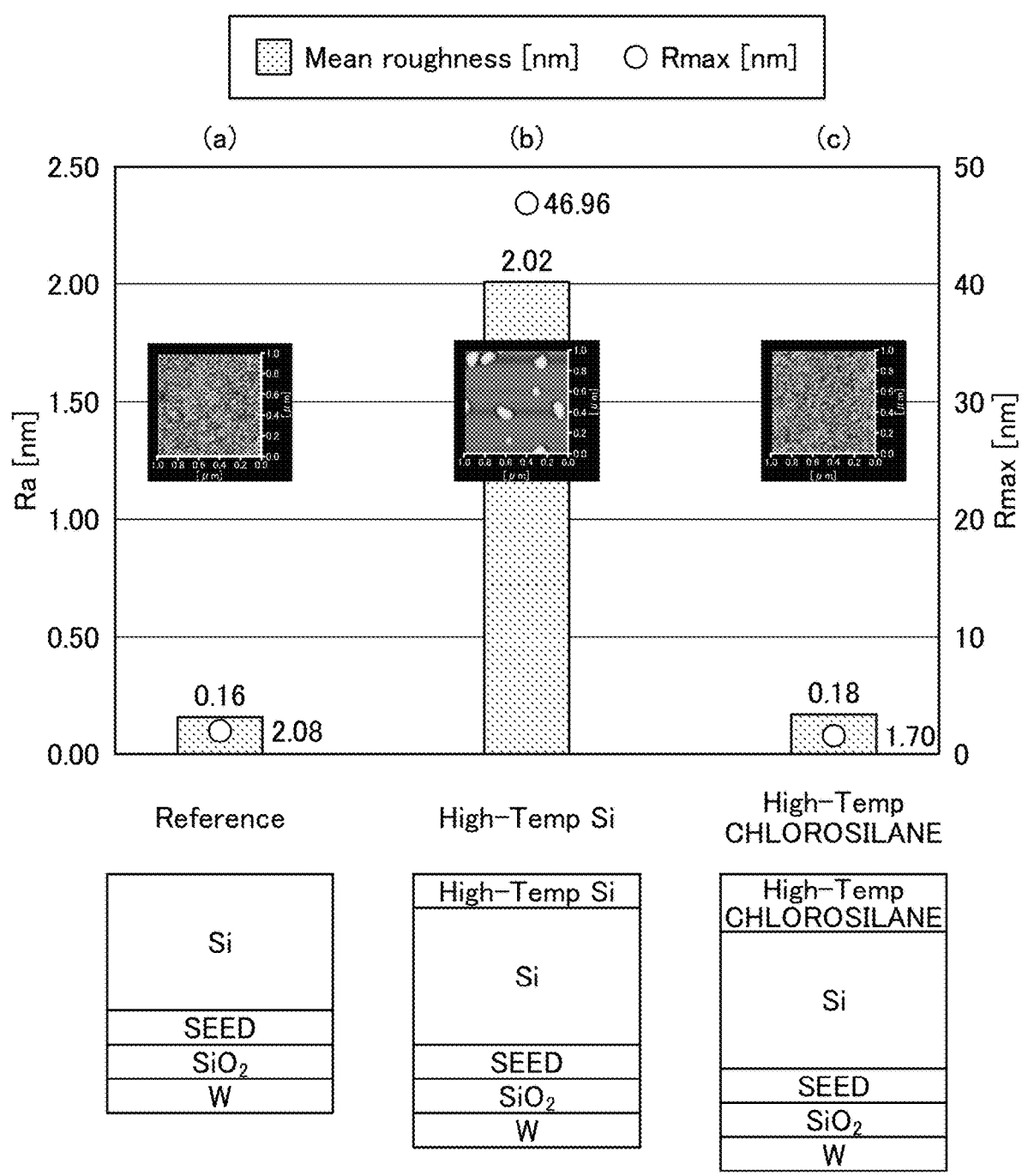
FIG. 5 is a diagram illustrating measurement results of a surface roughness measured by AFM.

FIG. 5 is a diagram illustrating the result of the surface roughness measured by AFM. The vertical axis indicates a mean surface roughness Ra[nm] and a maximum surface roughness Rmax[nm].

Portion (a) in FIG. 5 illustrates the state of the reference data in which the silicon film was only deposited. The average surface roughness Ra is 0.16, and the maximum average roughness Rmax is 2.08. This indicates that the surface roughness in the portion (a) is low.

Portion (b) in FIG. 5 illustrates an example in which the silicon film was deposited, followed by depositing $SiH_4$ gas at 580° C. The portion (b) in FIG. 5, crystal grains were formed, and the average surface roughness Ra increased to 2.02 while the maximum surface roughness Rmax increased to 46.96. Thus, deposition while supplying chlorosilane was indicated to allow crystallization while maintaining flatness compared to deposition of $SiH_4$ gas at high temperatures.

Portion (c) in FIG. 5 illustrates an example in which the silicon film was deposited at 580° C. while supplying chlorosilane in the method of depositing the silicon film according to the present embodiment. The average surface roughness Ra is as low as expected, being at 0.18, and the maximum surface roughness Rmax is 1.70. This indicates that crystallization is assured while maintaining the flatness.

As described above, according to the method of depositing the silicon film and the film deposition apparatus in the present embodiment, crystallization can be achieved while maintaining the surface flatness of the silicon film. Such surface flattening provides excellent device properties.

When the crystal grains are formed, a phenomenon, such that the silicon film is pulled on the crystal grain and the underlying silicon oxide film is exposed, is caused when the silicon film is thin. However, the method of depositing the silicon film and the film deposition apparatus according to the present embodiment are applicable regardless of the thickness of the silicon film.

While the preferred embodiments and embodiments of the present disclosure have been described in detail above, the present disclosure is not limited to the embodiments and embodiments described above, and various modifications and substitutions may be made to the embodiments and examples described above without departing from the scope of the present disclosure.

What is claimed is:

1. A method of depositing a silicon film, the method comprising:
   supplying a silicon-containing gas on a seed layer;
   depositing an amorphous silicon film on the seed layer, wherein the amorphous silicon film is deposited at a first temperature;
   supplying chlorosilane gas to the amorphous silicon film;
   crystallizing the amorphous silicon film while forming a chlorosilane cap layer on the amorphous silicon film, wherein the chlorosilane cap layer is formed at a second temperature higher than the first temperature; and
   annealing the chlorosilane cap layer and the amorphous silicon film at a third temperature higher than the second temperature.

2. The method of depositing a silicon film according to claim 1,
   wherein the first temperature is less than 540° C., and
   wherein the second temperature is 500° C. or higher and 700° C. or lower.

3. The method of depositing a silicon film according to claim 2,
   wherein the first temperature is 450° C. or higher and 500° C. or lower, and
   wherein the second temperature is 560° C. or higher and 580° ° C. or lower.

4. The method of depositing a silicon film according to claim 1,
   wherein the silicon-containing gas is monosilane or disilane, and
   wherein the chlorosilane gas is dichlorosilane.

\* \* \* \* \*